US008349156B2

(12) United States Patent
Stowell et al.

(10) Patent No.: US 8,349,156 B2
(45) Date of Patent: Jan. 8, 2013

(54) MICROWAVE-ASSISTED ROTATABLE PVD

(75) Inventors: Michael W. Stowell, Loveland, CO (US); Richard Newcomb, McKeesport, PA (US)

(73) Assignee: Applied Materials, Inc., Santa Clara, CA (US)

( * ) Notice: Subject to any disclaimer, the term of this patent is extended or adjusted under 35 U.S.C. 154(b) by 1021 days.

(21) Appl. No.: 12/120,391

(22) Filed: May 14, 2008

(65) Prior Publication Data

US 2009/0283400 A1    Nov. 19, 2009

(51) Int. Cl.
*C23C 14/34*    (2006.01)
(52) U.S. Cl. ......... 204/298.38; 204/298.06; 204/298.08; 204/298.12; 204/298.16; 204/298.26; 204/298.2; 204/298.21; 204/298.22; 204/298.23
(58) Field of Classification Search ............. 204/298.06, 204/298.08, 298.12, 298.16, 298.26, 298.2, 204/298.38, 298.21, 298.22, 298.23, 192.12
See application file for complete search history.

(56) References Cited

U.S. PATENT DOCUMENTS

| | | | |
|---|---|---|---|
| 3,999,918 A | 12/1976 | Landsman | |
| 4,185,252 A | 1/1980 | Gerlach | |
| 4,374,158 A | 2/1983 | Taniguchi et al. | |
| 4,511,520 A | 4/1985 | Bowen | |
| 4,521,447 A | 6/1985 | Ovshinsky et al. | |
| 4,545,646 A | 10/1985 | Chern et al. | |
| 4,927,704 A | 5/1990 | Reed et al. | |
| 4,953,498 A | 9/1990 | Hashizume et al. | |
| 5,006,218 A | 4/1991 | Yoshida et al. | |
| 5,149,375 A | 9/1992 | Matsuyama | |
| 5,178,739 A | 1/1993 | Barnes et al. | |
| 5,242,566 A | 9/1993 | Parker | |
| 5,290,993 A * | 3/1994 | Kaji et al. ................. 219/121.43 |
| 5,304,277 A * | 4/1994 | Ohara et al. ............. 156/345.42 |
| 5,387,288 A | 2/1995 | Shatas | |
| 5,527,391 A | 6/1996 | Echizen et al. | |
| 5,643,638 A | 7/1997 | Otto et al. | |
| 5,672,211 A | 9/1997 | Mai et al. | |
| 5,688,382 A | 11/1997 | Besen et al. | |
| 5,749,966 A | 5/1998 | Shates | |
| 5,886,864 A | 3/1999 | Dvorsky | |

(Continued)

FOREIGN PATENT DOCUMENTS

JP        63287910 A    11/1988

(Continued)

OTHER PUBLICATIONS

Machine Translation of JP 06017247A to Harano. Jan. 25, 1994.*

(Continued)

*Primary Examiner* — Keith Hendricks
*Assistant Examiner* — Jason M Berman
(74) *Attorney, Agent, or Firm* — Kilpatrick Townsend & Stockton LLP

(57) ABSTRACT

Disclosed invention uses a coaxial microwave antenna to enhance ionization in PVD or IPVD. The coaxial microwave antenna increases plasma density homogeneously adjacent to a sputtering cathode or target that is subjected to a power supply. The coaxial microwave source generates electromagnetic waves in a transverse electromagnetic (TEM) mode. The invention also uses a magnetron proximate the sputtering cathode or target to further enhance the sputtering. Furthermore, for high utilization of expensive target materials, a target can rotate to improve the utilization efficiency. The target comprises dielectric materials, metals, or semiconductors. The target also has a cross section being substantially symmetric about a central axis that the target rotates around. The target may have a substantially circular or annular a cross section.

19 Claims, 11 Drawing Sheets

U.S. PATENT DOCUMENTS

| | | | |
|---|---|---|---|
| 5,900,699 | A | 5/1999 | Samukawa et al. |
| 5,965,246 | A | 10/1999 | Guiselin et al. |
| 5,985,102 | A * | 11/1999 | Leiphart ............... 204/192.12 |
| 5,990,984 | A | 11/1999 | Meredith et al. |
| 6,061,077 | A | 5/2000 | Kashiwaya et al. |
| 6,096,389 | A | 8/2000 | Kanai |
| 6,121,930 | A | 9/2000 | Grangeat et al. |
| 6,238,527 | B1 | 5/2001 | Sone et al. |
| 6,290,825 | B1 | 9/2001 | Fu |
| 6,306,265 | B1 | 10/2001 | Fu et al. |
| 6,311,638 | B1 | 11/2001 | Ishii et al. |
| 6,340,417 | B1 | 1/2002 | Krivokapic |
| 6,357,385 | B1 | 3/2002 | Ohmi et al. |
| 6,424,298 | B1 | 7/2002 | Nishikawa et al. |
| 6,620,296 | B2 | 9/2003 | Gogh et al. |
| 6,805,779 | B2 | 10/2004 | Chistyakov |
| 6,806,651 | B1 | 10/2004 | Chistyakov |
| 6,853,142 | B2 | 2/2005 | Chistyakov |
| 6,868,800 | B2 | 3/2005 | Moroz |
| 6,896,773 | B2 | 5/2005 | Chistyakov |
| 7,166,661 | B2 | 1/2007 | Kuramoto et al. |
| 7,390,573 | B2 | 6/2008 | Korevaar et al. |
| 7,459,182 | B2 | 12/2008 | Xiong et al. |
| 7,815,982 | B2 | 10/2010 | Iwanaga |
| 2001/0025607 | A1 | 10/2001 | Lebar et al. |
| 2002/0041044 | A1 | 4/2002 | Saito et al. |
| 2002/0092766 | A1 * | 7/2002 | Lampkin ............... 204/298.22 |
| 2002/0125423 | A1 | 9/2002 | Ebeling et al. |
| 2003/0072932 | A1 | 4/2003 | Gandon |
| 2003/0150846 | A1 | 8/2003 | Ishii et al. |
| 2003/0168172 | A1 | 9/2003 | Glukhoy |
| 2003/0183518 | A1 | 10/2003 | Glocker et al. |
| 2003/0209422 | A1 | 11/2003 | Wang et al. |
| 2004/0011466 | A1 | 1/2004 | Matsumoto et al. |
| 2004/0265507 | A1 | 12/2004 | Xiong et al. |
| 2005/0121835 | A1 | 6/2005 | Herod et al. |
| 2005/0211170 | A1 | 9/2005 | Hanawa et al. |
| 2006/0078717 | A1 | 4/2006 | Yamaya et al. |
| 2006/0166515 | A1 | 7/2006 | Karim et al. |
| 2006/0191478 | A1 | 8/2006 | Gondhalekar et al. |
| 2006/0196766 | A1 | 9/2006 | Chen |
| 2006/0208634 | A1 | 9/2006 | Schaepkens et al. |
| 2006/0240232 | A1 | 10/2006 | Faris |
| 2007/0045103 | A1 | 3/2007 | Lee et al. |
| 2007/0048509 | A1 | 3/2007 | Yoneyama et al. |
| 2007/0080056 | A1 | 4/2007 | German et al. |
| 2007/0098916 | A1 | 5/2007 | Stowell |
| 2007/0102634 | A1 | 5/2007 | Frey et al. |
| 2007/0119546 | A1 | 5/2007 | Collins et al. |
| 2007/0160822 | A1 | 7/2007 | Bristow et al. |
| 2007/0181145 | A1 | 8/2007 | Ishizuka et al. |
| 2007/0218264 | A1 | 9/2007 | Gueneau et al. |
| 2008/0118734 | A1 | 5/2008 | Goodwin et al. |
| 2008/0173402 | A1 | 7/2008 | Suzuki et al. |
| 2008/0226924 | A1 | 9/2008 | Okubo et al. |
| 2009/0232977 | A1 | 9/2009 | Morinaga et al. |
| 2009/0238993 | A1 | 9/2009 | Stowell et al. |
| 2010/0078320 | A1 | 4/2010 | Stowell |
| 2011/0076420 | A1 | 3/2011 | Stowell |
| 2011/0097517 | A1 | 4/2011 | Stowell et al. |

FOREIGN PATENT DOCUMENTS

| | | | |
|---|---|---|---|
| JP | 02050960 A | | 2/1990 |
| JP | 05-263223 A | | 10/1993 |
| JP | 06-017247 A | | 1/1994 |
| JP | 06017247 A | * | 1/1994 |
| JP | 06216047 A | | 8/1994 |
| JP | 06-102827 B2 | | 12/1994 |
| JP | 08009780 B2 | | 1/1996 |
| JP | 2001-126899 A | | 5/2001 |
| JP | 2002-004044 A | | 1/2002 |
| JP | 2005-508728 A | | 4/2005 |
| JP | 2007-516347 A | | 6/2007 |
| KR | 10-2007-0112210 A | | 11/2007 |
| WO | WO 99/35302 A1 | | 7/1999 |
| WO | WO 2007-096482 A2 | | 8/2007 |

OTHER PUBLICATIONS

U.S. Appl. No. 12/833,473, filed Jul. 9, 2010, Stowell.
U.S. Appl. No. 12/833,524, filed Jul. 9, 2010, Stowell.
U.S. Appl. No. 12/833,571, filed Jul. 9, 2010, Stowell et al.
PCT International Search Report and Written Opinion mailed Sep. 25, 2009; International Application No. PCT/US2009/035325, 10 pages.
Zajickova, "Deposition of Protective Coatings in RF Organosilicon Discharges," Jan. 31, 2007, Institute of Physics Publishing, pp. 123-132.
PCT International Search Report and Written Opinion mailed Sep. 15, 2009; International Application No. PCT/US2009/034551, 12 pages.
PCT International Search Report and Written Opinion mailed Nov. 4, 2009; International Application No. PCT/US2009/044213, 12 pages.
Author Unknown, "Ultrafine Zinc Oxide," Sumitomo Osaka Cement Co., Ltd., 2 pages, no date.
Author Unknown, "Zinc Oxide Profile," obtained on Oct. 15, 2007 from website http://www.mountainroseherbs.com/learn/zinc_oxide.php, 2 pages.
Erlat, Ahmet G., et al., "Morphology and gas barrier properties of thin SiOx coatings and polycarbonate: Correlations with plasma-enhanced chemical vapor deposition conditions," J. Mater. Res., vol. 15, No. 3, Mar. 2000, pp. 704-717.
U.S. Appl. No. 12/050,373, filed Mar. 18, 2008, Stowell et al.
U.S. Appl. No. 12/070,660, filed Feb. 20, 2008, Stowell et al.
U.S. Appl. No. 12/077,375, filed Mar. 19, 2008, Stowell et al.
U.S. Appl. No. 12/115,717, filed May 6, 2008, Stowell et al.
U.S. Appl. No. 12/238,685, filed Sep. 26, 2008, Stowell.
U.S. Appl. No. 12/238,664, filed Sep. 26, 2008, Stowell.
Tomar, V.K., et al., "Depositions and characterization of SiOn using HMDS for Photonics applications," abstract, obtained on Oct. 16, 2007 from website http://www.iop.org/EJ/abstract/0268-1242/22/2/008, 2 pages.
Wikipedia, "Microstrip", obtained online at http://en.wikipedia.org/wiki/Microstrip on Jan. 25, 2008, 5 pages.
Wikipedia, "Microwave", obtained online at http://en.wikipedia.org/wiki/Microwave on Dec. 13, 2007, 7 pages.
Zajickova, L. et al., "Deposition of protective coatings in rf organosilicon discharges," abstract, obtained on Oct. 16, 2007 on website http://www.iop.org.EJ/abstract/0963-0252/16/1/S14, 2 pages.
PCT International Search Report and Written Opinion mailed Dec. 18, 2009; International Application No. PCT/US2009/042891; 10 pages.
PCT International Search Report and Written Opinion mailed Jan. 12, 2010; International Application No. PCT/US2009/043986; 10 pages.
PCT International Search Report and Written Opinion mailed Apr. 7, 2010; International Application No. PCT/US2009/055626, 12 pages.
Dickson, M. et al., "Radial uniformity of an external-coil ionized physical vapor deposition source," J. Vac. Sci. Technol. B 16(2), Mar./Apr. 1998, pp. 523-531.
Boisse-Laporte, "New Type of plasma reactor for thin film deposition: magnetron plasma process assisted by microwaves to ionise sputter vapour," Surface and Coatings Technology, 2004, 179, 176-181.
Liop et al., "Molecular orientation in plastic optical fibres," Jan. 14, 1994, Journal of Physics D: Applied Physics, 27, 25-28.

* cited by examiner

MICROWAVE-ASSISTED ROTATABLE PVD

BACKGROUND OF THE INVENTION

Glow discharge thin film deposition processes are extensively used for industrial applications and materials research, especially in creating new advanced materials. Although chemical vapor deposition (CVD) generally exhibits superior performance for deposition of materials in trenches or holes, physical vapor deposition (PVD) is preferred because of its simplicity and lower cost. In PVD, magnetron sputtering is often preferred, as it may have about a hundred times increase in deposition rate and about a hundred times lower required discharge pressure than non-magnetron sputtering. Inert gases, especially argon, are usually used as sputtering agents because they do not react with target materials. When a negative voltage is applied to a target, positive ions, such as positively charged argon ions, hit the target and knock the atoms out. Secondary electrons are also ejected from the target surface. The magnetic field can trap the secondary electrons close to the target and the secondary electrons can result in more ionizing collisions with inert gases. This enhances the ionization of the plasma proximate the target and leads to a higher sputtering rate. It also means that the plasma can be sustained at a lower pressure. In conventional magnetron sputtering, higher deposition rate may be achieved by increasing the power to the target or decreasing the distance from the target. However, a drawback is that magnetized plasma tends to have larger variations in plasma density, because the strength of the magnetic field significantly varies with distance. This non-homogeneity may cause complications for deposition of large areas. Also, conventional magnetron sputtering has relatively low deposition rate.

Unlike evaporative techniques, the energy of ions or atoms in PVD is comparable to the binding energy of typical surfaces. This would in turn help increase atom mobility and surface chemical reaction rates so that epitaxial growth may occur at reduced temperatures and synthesis of chemically metastable materials may be allowed. By using energetic atoms or ions, compound formation may also become easier. An even greater advantage can be achieved if the deposition material is ionized. In this case, the ions can be accelerated to desired energies and guided in direction by using electric or magnetic fields to control film intermixing, nano- or microscale modification of microstructure, and creation of metastable phases. Because of the interest in achieving a deposition flux in the form of ions rather than neutrals, several new ionized physical vapor deposition (IPVD) techniques have been developed to ionize the sputtered material and subsequently direct the ions toward the substrate using a plasma sheath that is generated by using an RF bias on the substrate.

The ionization of atoms requires a high density plasma, which makes it difficult for the deposition atoms to escape without being ionized by energetic electrons. Capacitively generated plasmas are usually very lightly ionized, resulting in low deposition rate. Denser plasma may be created using inductive discharges. Inductively coupled plasma may have a plasma density of 1011 ions/cm$^3$, approximately 100 times higher than comparable capacitively generated plasma. A typical inductive ionization PVD uses an inductively coupled plasma that is generated by using an internal coil with a 13.56-MHz RF source. A drawback with this technique is that ions with about 100 eV in energy bombard the coil, erode the coils and then generate sputtered contaminants that may adversely affect the deposition. Also, the high energy of the ions may cause damage to the substrate. Some improvement has been made by using an external coil to resolve the problem associated with the internal ICP coil.

Another technique for increasing plasma density is using a microwave frequency source. It is well known that at low frequencies, electromagnetic waves do not propagate in a plasma, but are instead reflected. However, at high frequencies such as typical microwave frequency, electromagnetic waves effectively allow direct heating of plasma electrons. As microwaves input energy into the plasma, collisions can occur to ionize the plasma so that higher plasma density can be achieved. Typically, horns are used to inject microwave or a small stub antenna is placed in the vacuum chamber adjacent to the sputtering cathode for inputting the microwave into the chamber. However, this technique does not provide a homogeneous assist to enhance plasma generation. It also does not provide enough plasma density to sustain its own discharge without the assistance of the sputtering cathode. Additionally, scale up of such systems for large area deposition is limited to a length on the order of 1 meter or less because of non-linearity.

There still remains a need for providing a high density homogeneous discharge adjacent to a sputtering cathode to increase localized ionization efficiency and depositing films over large areas. There is also a need for lowering the energy of the ions to reduce surface damage to the substrate and thus reduce defect densities. There is a further need to affect the microstructure growth and deposition coverage such as gap-fill in narrow trenches and to enhance film chemistry through controlling ion density and ion energy in the bulk plasma and proximate the substrate surface.

BRIEF SUMMARY OF THE INVENTION

Embodiments of the invention use a coaxial microwave antenna to enhance ionization in PVD or IPVD. The coaxial microwave antenna increases plasma density homogeneously adjacent to a sputtering cathode or target that is subjected to a power supply. The coaxial microwave source generates electromagnetic waves in a transverse electromagnetic (TEM) mode. Embodiments of the invention also use a magnetron proximate the sputtering cathode or target to further enhance the sputtering. Furthermore, for high utilization of expensive target materials, a target can rotate to improve the utilization efficiency. The target comprises dielectric materials, metals, or semiconductors. The target also has a cross section being substantially symmetric about a central axis that the target rotates around. In a specific embodiment, the target may have a substantially circular or annular cross section.

In one set of embodiments of the invention, a coaxial microwave source may be disposed outside a target to assist PVD or IPVD. The target may be subjected to an AC, RF or pulsed power to cause it to act as a cathode if the target comprises a dielectric material or a semiconductor. The target may be subjected to a DC voltage to cause it to act as a cathode if the target comprises a metal. The coaxial microwave source may be linear and generates electromagnetic waves in a transverse electromagnetic (TEM) mode. A planar microwave source may comprise a plurality of parallel coaxial microwave line sources.

In another set of embodiments of the invention, a magnetron or a plurality of magnetrons may be added proximate a target that is configured to rotate for higher material utilization. The target is subjected to at least one of the DC, AC, RF or pulsed power. A coaxial microwave source is located outside the target as a secondary source to enhance ionization. The magnetrons may help confine secondary electrons and further enhance ionization. In a special case of one magnetron inside the target, the magnetron is preferably in a horizontal position and proximate the bottom of the target to enhance localized ionization above the substrate. Moreover, in the case of a plurality of magnetrons such as two magnetrons inside the target, the magnetrons are preferably positioned at an angle to the horizontal position. The two magnetrons may be located symmetrically about the vertical central axis of the target. Furthermore, magnetrons may locate outside the targets for providing magnetic field adjacent to the target surface to enhance ionization. An electric potential may be formed between the magnetrons to further enhance ionization.

Embodiments of the invention still further include a configuration of two rotatable targets for depositing a film over a substrate, where an antenna is outside the two targets. The two targets are disposed substantially symmetrically about the antenna. Proximate each of the targets, a magnetron or a plurality of magnetrons may be added for localized ionization enhancement.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings.

DETAILED DESCRIPTION OF THE INVENTION

1. Overview of Microwave-Assisted PVD

Figure 1:
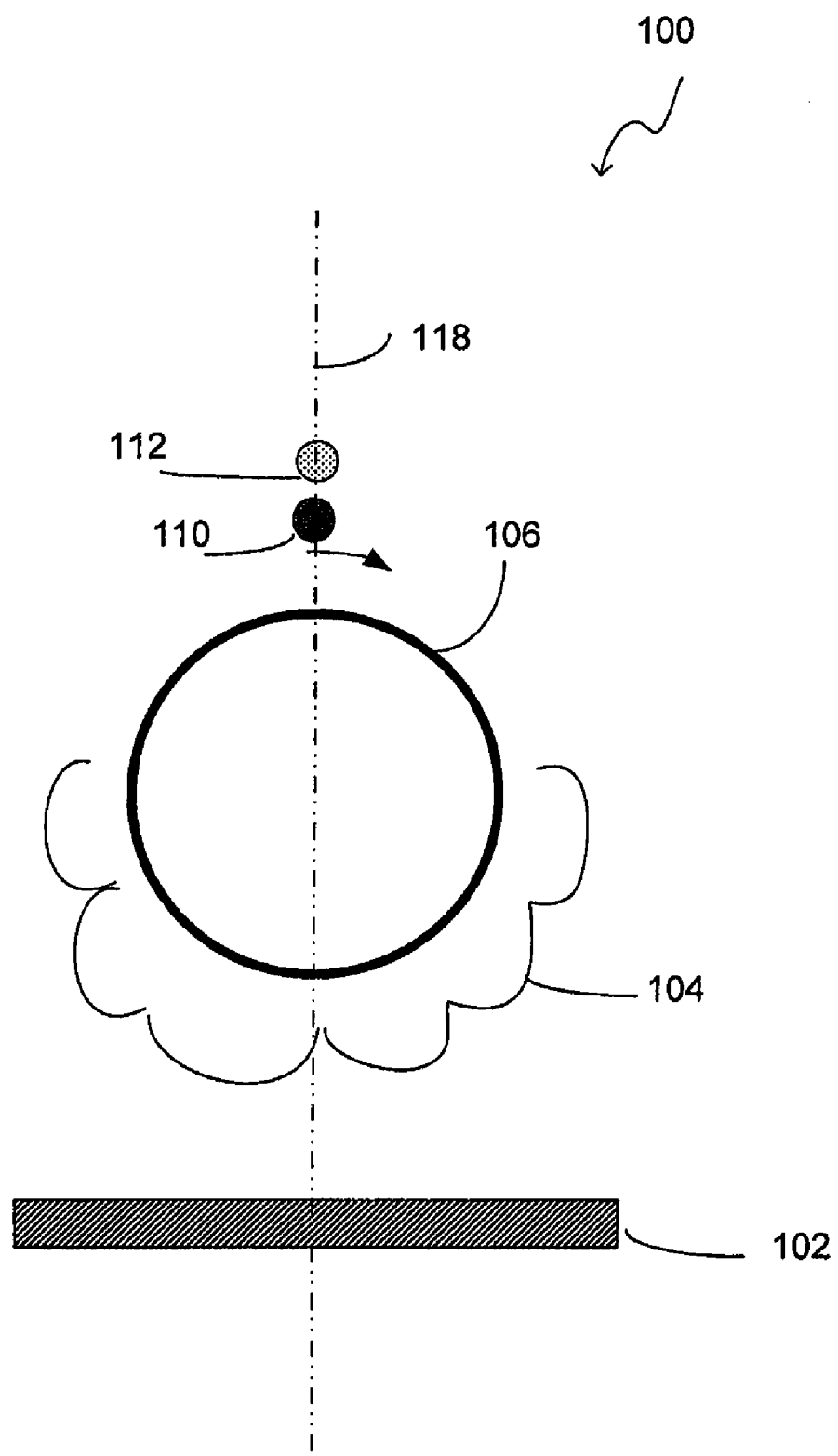
FIG. 1 illustrates a simplified schematic for microwave-assisted rotatable sputtering deposition with a coaxial microwave source outside a rotatable target.

Microwave-assisted PVD has been developed to achieve higher plasma densities (e.g. ~$10^{12}$ ions/cm$^3$) and higher deposition rate, as a result of improved power coupling and absorption at 2.45 GHz when compared to a typical radio frequency (RF) coupled plasma sources at 13.56 MHz. One drawback of the RF plasma is that a large portion of the input power is dropped across a plasma sheath (dark space). By using microwave plasma, a narrow plasma sheath is formed and more power can be absorbed by the plasma for creation of radical and ion species, which increases the plasma density and reduces collision broadening of the ion energy distribution to achieve a narrow energy distribution.

Microwave plasma also has other advantages such as lower ion energies with a narrow energy distribution. For instance, microwave plasma may have low ion energy of 1-25 eV, which leads to lower damage when compared to RF plasma. In contrast, standard planar discharge would result in high ion energy of 100 eV with a broader distribution in ion energy, which would lead to higher damage, as the ion energy exceeds the binding energy for most materials of interest. This ultimately inhibits the formation of high quality crystalline thin films through introduction of intrinsic defects. With low ion energy and narrow energy distribution, microwave plasma helps in surface modification and improves coating properties.

In addition, lower substrate temperature (e.g. lower than 200° C., for instance at 100° C.) is achieved as a result of using microwave plasma source, as increased plasma density at lower ion energy helps reduce defect density of films. Such a lower temperature allows better microcrystalline growth in kinetically limited conditions. Also, standard planar discharge without magnetrons normally requires pressure greater than about 50 mtorr to maintain self-sustained discharge, as plasma becomes unstable at pressure lower than about 50 mtorr. The microwave plasma technology described herein allows the pressure to range from about $10^{-6}$ torr to 1 atmospheric pressure. Therefore, processing windows (e.g. temperature and pressure) are extended by using a microwave plasma source.

In the past, one drawback associated with microwave source technology in the vacuum coating industry was the difficulty in maintaining homogeneity during the scale up from small wafer processing to very large area processing. Microwave reactor designs in accordance with embodiments of the invention address these problems. Arrays of coaxial plasma line sources have been developed to deposit substantially uniform coatings of ultra large area (greater than 1 m$^2$) at high deposition rate to form dense and thick films (e.g. 5-10 µm thick).

An advanced pulsing technique has been developed to control the microwave power for generating plasma, and thus to control the plasma density and plasma temperature. This advanced pulsing technique may reduce the thermal load disposed over substrate. This feature is relevant when the substrate has a low melting point or a low glass transition temperature, such as in the case of a polymer substrate. The advanced pulsing technique allows high power pulsing into plasma with off times in between pulses, which reduces the need for continuous heating of the substrate. Another aspect of the pulsing technique is significant improvement in plasma efficiency compared to continuous microwave power.

2. Exemplary Microwave-Assisted Rotatable Sputtering Deposition

FIG. 1 shows a simplified microwave-assisted rotatable sputtering deposition system 100 with a target. Target 106 in a cylindrical tube form can rotate around the center of the target to provide higher utilization of the target material, which is often very expensive. Antenna 110 is a coaxial microwave plasma line source, and is located outside the target 106 on a central axis 118. A gas supply 112 located on the central axis 118 above the target 106 provides a continuous flow of inert gases, such as argon, helium, xenon, and mixtures thereof, to act as sputtering agents. The gas supply 112 may also be located in between the target 106 and substrate 102 (not shown). Plasma 104 is formed proximate the outer surface of the target 106. A film of the target material may be formed on the substrate 102 located below the target 106. The substrate 102 may be biased to attract ions to form a film on the substrate 102.

Figure 2:
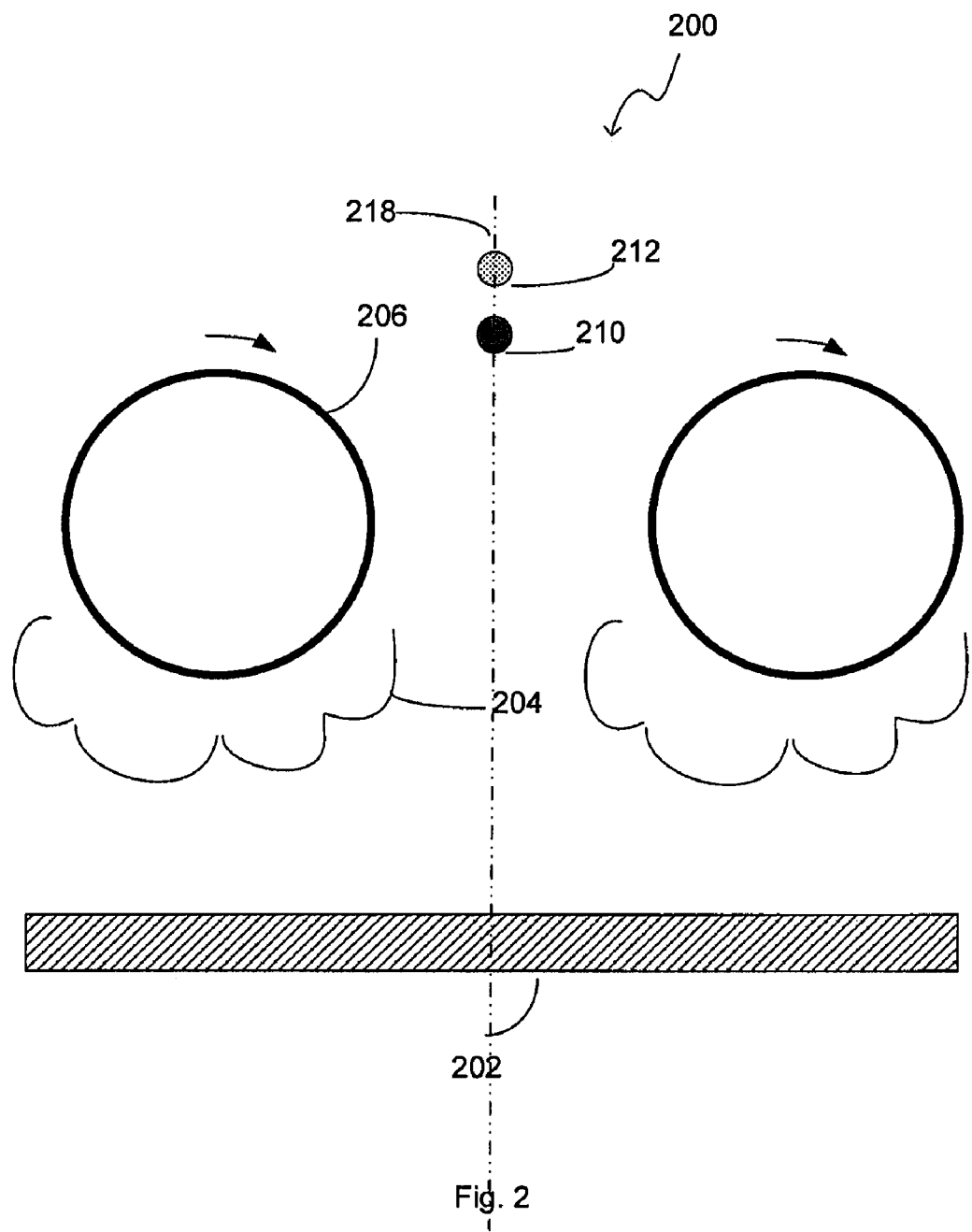
FIG. 2 shows a simplified schematic for a twin configuration of microwave-assisted rotatable sputtering deposition with a coaxial microwave source outside a rotatable target.

In an alternative embodiment illustrated in FIG. 2, a configuration 200 comprises two rotatable targets positioned substantially symmetrically about a microwave source or antenna. Again, target 206 is configured to rotate for providing higher utilization of the target material. Antenna 210 comprises a coaxial microwave line source and is located outside the target at the centerline 210. A gas supply 212 located along the central axis 218 above the two targets provides a continuous flow of inert gases such as argon, helium, xenon and mixtures thereof, to act as sputtering agents, although the gas supply 212 may be in any position between the target 206 and substrate 202. Plasma 204 is formed proximate the outer surface of the target 206. A film of the target material is formed on the substrate 202 located below the target 206. The substrate 202 may be biased to attract ions to form a film on the substrate 202.

Figure 3:
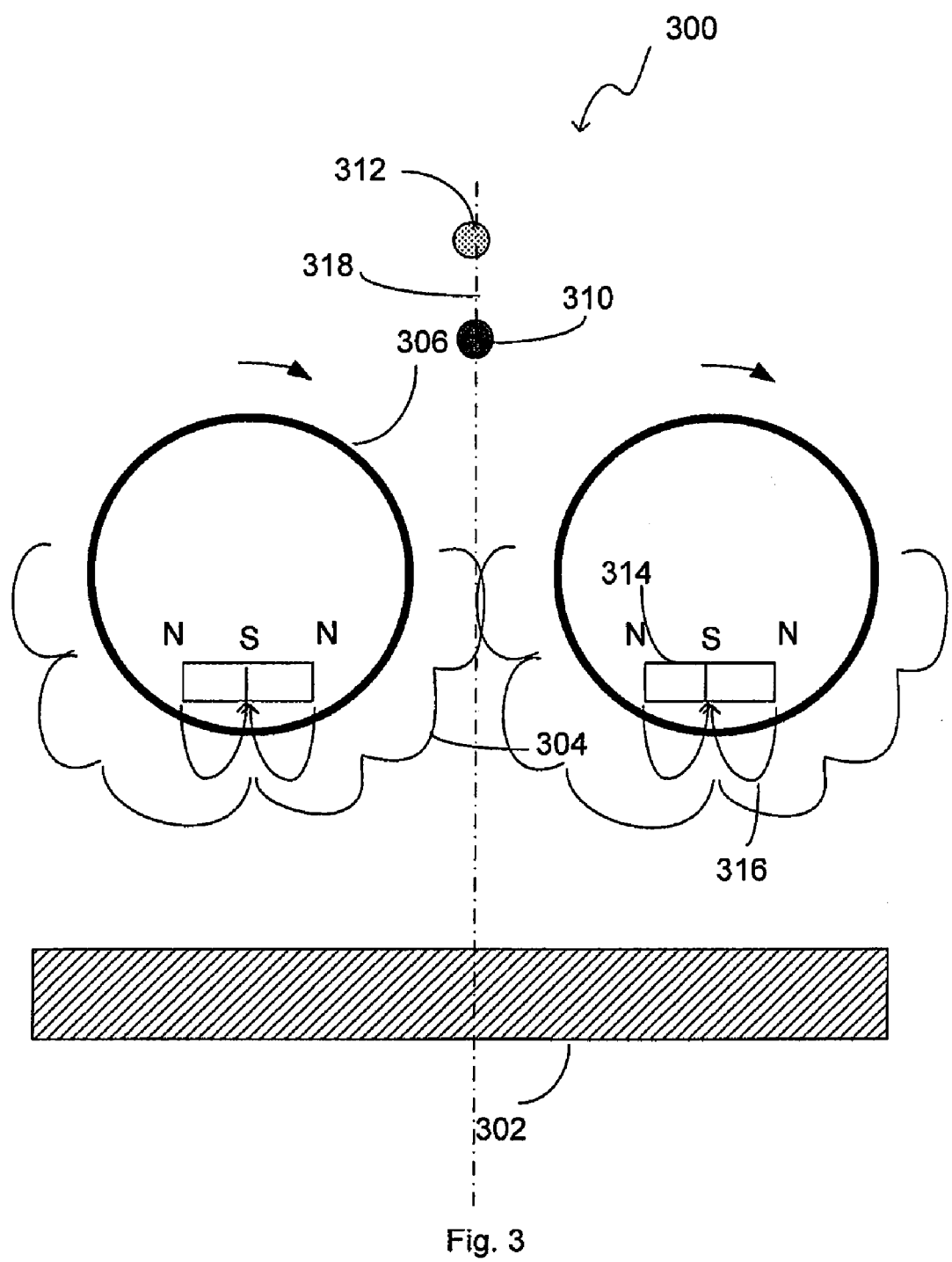
FIG. 3 shows a simplified schematic for a configuration of microwave-assisted rotatable magnetron sputtering deposition with two rotatable targets and a magnetron inside each of the targets.

In another embodiment illustrated in FIG. 3, a configuration 300 comprises two rotatable targets with one magnetron in each of the targets. Again, the two targets are positioned substantially symmetrically about a microwave source or antenna. Target 306 can rotate to provide higher utilization of the target materials. Antenna 310 comprises a coaxial microwave source and is located outside the target 306 at the centerline 318. Magnetron 314 may be in a horizontal position and proximate the bottom of the target. As illustrated by magnetic field line 316 in FIG. 3, the magnetic field is generated outside the target 306 and localized above substrate 302. This magnetic field helps confine secondary electrons proximate the target surface and enhances collision and thus ionization.

The inventors performed experiments to show that the deposition efficiency may increase about 60 times by using a secondary microwave source to assist in magnetron sputtering. The plasma homogeneity is also significantly improved as a result of microwave injection.

A gas supply 312 located along the central axis 318 above the two targets 306 provides a continuous flow of inert gases such as argon, to act as sputtering agents. Plasma 304 is formed proximate the outer surface of the target 306. A film of the target material is formed on the substrate 302 located below the target 306. The substrate 302 may be biased to attract ions to form a film on the substrate 302.

Figure 4:
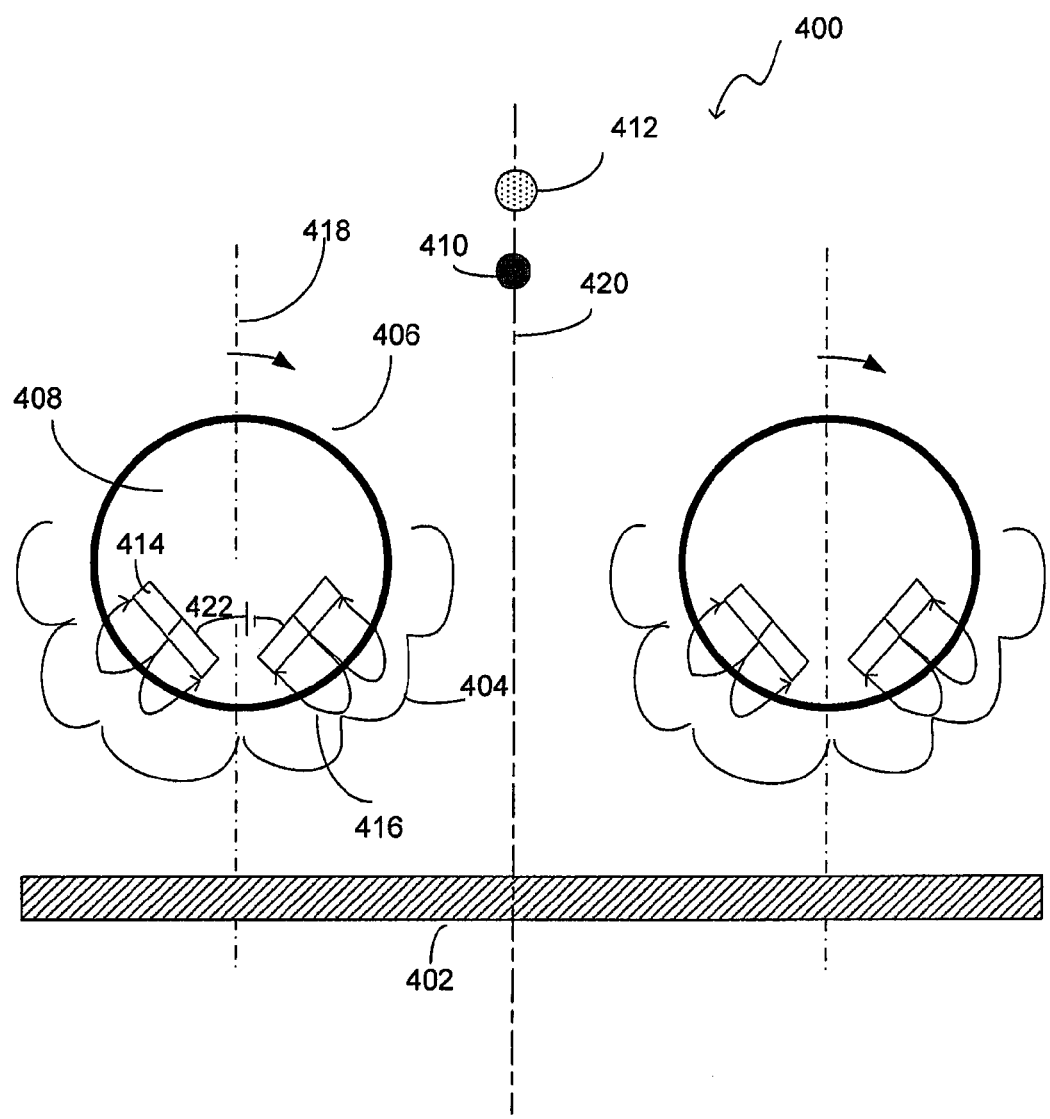
FIG. 4 depicts an alternative schematic for microwave-assisted rotatable magnetron sputtering deposition with two rotatable targets and two magnetrons inside each of the targets.

FIG. 4 provides another configuration 400 with two rotatable targets, where the two rotatable targets 406 are positioned substantially symmetrically about a coaxial microwave source (antenna) 410. Two magnetrons 414 are located inside each of the two rotatable targets 406. The two magnetrons 414 are tilted from a vertical central axis 418 at an angle and are in a substantially symmetrical position relative to the central axis 418. Magnetic field line 416 shows that the magnetic field extends downward and outside the target 406. An electric potential 422 may exist between the two magnetrons and may therefore further enhance ionization. A gas supply line 412 is located on the central axis 420 above the target 406. Plasma 404 is generated outside the target 406 and above substrate 402.

Figure 5:
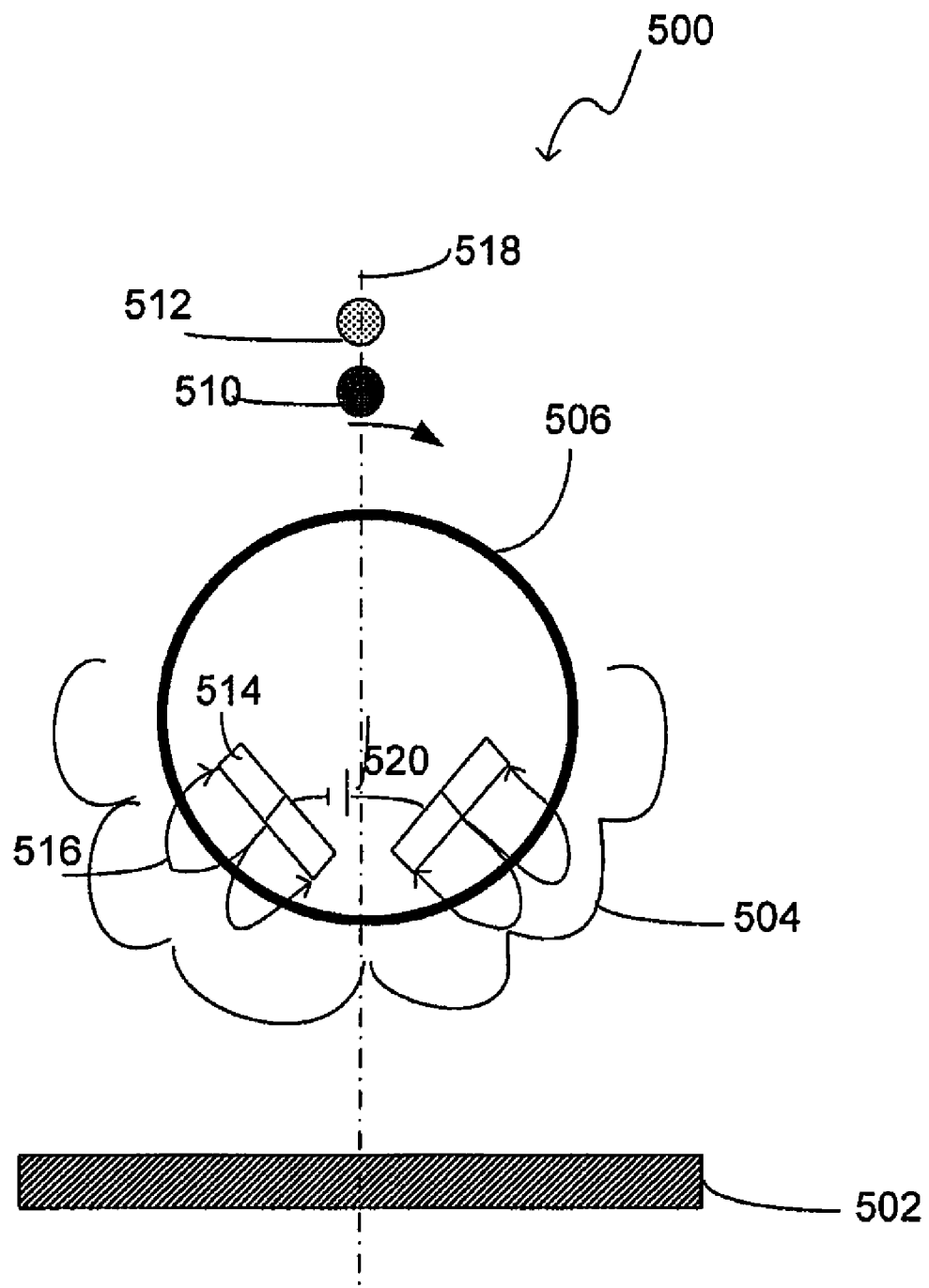
FIG. 5 provides a configuration of microwave-assisted rotatable magnetron sputtering deposition with a microwave source outside a target and two magnetrons inside the target.
Figure 6:
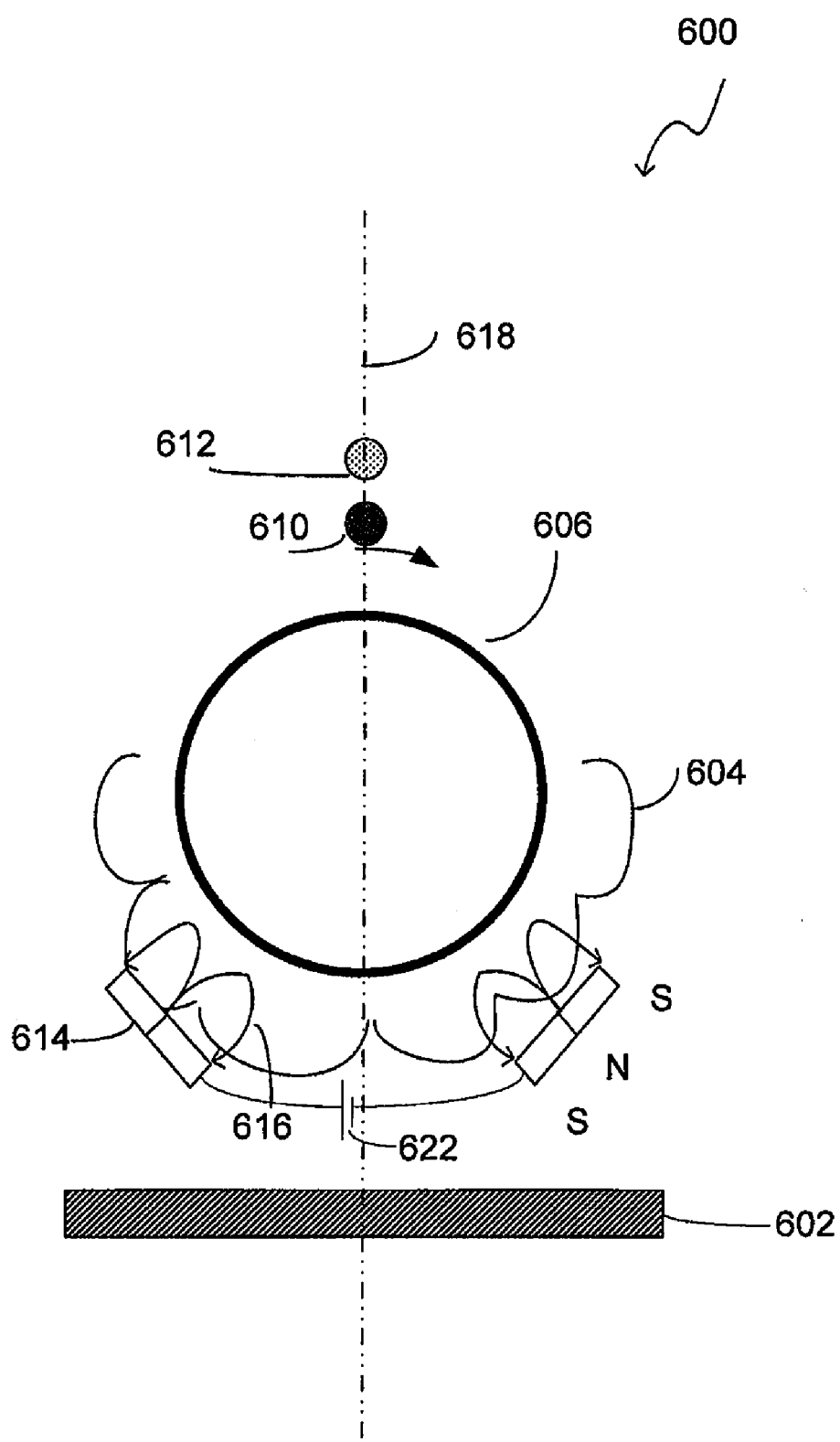
FIG. 6 depicts a different simplified schematic for a coaxial microwave-assisted rotatable magnetron sputtering deposition, where a microwave source and magnetrons locate outside a target.

FIG. 5 shows a different configuration 500 with one rotatable target 506 and magnetrons 514. Similar to FIG. 4, an antenna 510 is outside the target 506 on a central axis 518. The two magnetrons 514 are substantially symmetrically positioned inside the target 506 relative to the central axis 518. Magnetic field line 516 shows that the magnetic field extends downward and outside the target 506. An electric potential 520 may exist between the two magnetrons to further increase ionization. A gas supply line 512 is located at the central axis 518. Plasma 504 is formed outside the targets 506. FIG. 6 shows a configuration 600 similar to the configuration 500 shown in FIG. 5 except that the magnetrons are outside the target 606.

3. Sputtering Cathode and Conditions for Sustaining Plasma Discharge

For a target comprising a metal, such as aluminum, copper, titanium, or tantalum, a DC voltage may be applied to the target to cause the target to act as a cathode and the substrate to act as an anode. The DC voltage would help accelerate free electrons. The free electrons collide with sputtering agents such as argon (Ar) atoms from argon gas to cause excitation and ionization of Ar atoms. The excitation of Ar results in gas glow. The ionization of Ar generates $Ar^+$ and secondary electrons. The secondary electrons repeat the excitation and ionization process to sustain the plasma discharge.

Proximate the cathode, positive charges build up as the electrons move much faster than ions because of their smaller mass. Therefore, fewer electrons collide with Ar so that fewer collisions with the high energy electrons result in mostly ionization rather than excitation. A cathode dark space (plasma sheath) that is also called Crookes dark space is formed proximate the cathode. Positive ions entering the dark space are accelerated toward the cathode or target and bombard the target so that atoms are knocked out from the target and then transported to the substrate. Also, secondary electrons are generated to sustain the plasma discharge. If the distance between cathode to anode is less than the dark space, few excitations occur and discharge can not be sustained. On the other hand, if the Ar pressure in a chamber is too low, there would be larger electron mean free path such that secondary electrons would reach anode before colliding with Ar atoms. In this case, discharge also can not be sustained. Therefore, a condition for sustaining the plasma is $$L*P > 0.5 \text{ (cm-torr)}$$

where L is the electrode spacing and P is the chamber pressure. For instance, if a spacing between target and substrate is 10 cm, P should be greater than 50 mtorr.

The mean free path $\lambda$ of an atom in a gas is given by:

$$\lambda(\text{cm}) \sim 5 \times 10^{-3}/P \text{ (torr)}$$

If P is 50 mtorr, $\lambda$ is about 0.1 cm. This means that sputtered atoms or ions typically have hundreds of collisions before reaching the substrate. This reduces the deposition rate significantly. In fact, the sputtering rate R is inversely proportional to the chamber pressure and the spacing between target and substrate. Therefore, lowering required chamber pressure for sustaining discharge increases deposition rate.

With a secondary microwave source proximate the sputtering cathode, the sputtering system allows to run the cathode at a lower pressure, lower voltage and possibly higher deposition rate. By decreasing operational voltage, atoms or ions have lower energy so that damage to the substrate is reduced. With the high plasma density and lower energy plasma from microwave assist, high deposition rate can be achieved along with lower damage to the substrate.

Referring to FIGS. 1-6 again, targets 106, 206, 306, 406, 506 and 606 may be made of dielectric material, such as silicon oxide, aluminum oxide, or titanium oxide. The targets may be applied by AC, RF, or pulsed power to accelerate free electrons.

4. Exemplary Microwave-Assisted Rotatable Sputtering Deposition

Figure 7:
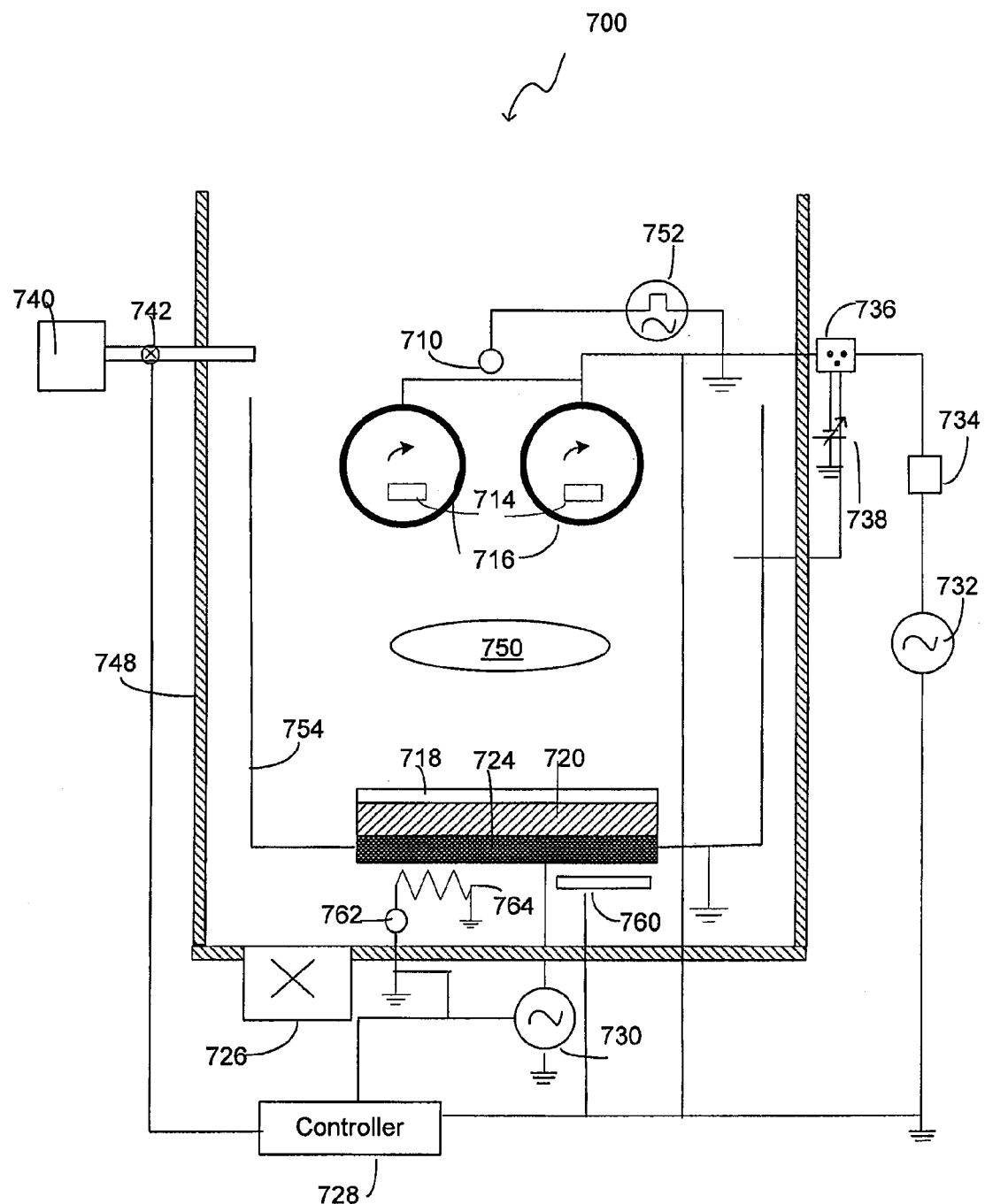
FIG. 7 is an exemplary simplified microwave-assisted rotatable PVD deposition system.

FIG. 7 depicts a simplified schematic, cross-sectional diagram of a microwave-assisted rotatable sputtering deposition system 700. The system may be used to practice embodiments of the invention. The system 700 includes a vacuum chamber 748, two rotatable targets 716, a coaxial microwave antenna 710 that is positioned between the two targets 716, a magnetron 714, a substrate supporting member 724, a vacuum pump system 726, a controller 728, a gas supply system 740, and a shield 754 for protecting the chamber walls and the sides of the substrate supporting member 724 from sputtering deposition. The following references, i.e. U.S. Pat. No. 6,620,296 B2, U.S. Patent Application Pub. No. US 2007/0045103 A1, and U.S. Patent Application Pub. No. US2003/0209422 A1, are cited here for exemplary physical vapor deposition (PVD) magnetron sputtering systems used by Applied Materials and others. The entire contents of each of the foregoing patents are incorporated herein by reference for all purposes.

Target 716 comprises a dielectric material or a metal that is deposited on a substrate 720 to form a film 718. The target 716 is configured to be rotated for maximizing the utilization of the target material. The target 716 is typically structured for removable insertion into the sputtering system 700. The target 716 is periodically replaced with new targets given that the PVD process erodes away the to-be-deposited material of each target.

Both DC power supply 738 and the high frequency or pulsed power supply 732 are coupled through a device to the target 716. The device may be a switch 736. The switch 736 selects power from either the DC power supply 738 or the power from the AC, RF or pulsed power supply 732. A relatively negative voltage source 738 provides a DC cathode voltage of a few hundred volts. The specific cathode voltage varies with design. As the target can act as a source of negatively charged particles, the target may also be referred to as the cathode. Those skilled in the art will realize that there may be many ways for switching DC and RF power that would fulfill the function. Furthermore, in some embodiments, it may be advantageous to have both DC and RF power coupled to the target simultaneously.

The sputtering rate may be further increased by using a magnetron as illustrated in FIG. 7 in addition to the microwave-assist. A magnetron 714 is generally positioned near the target 716, for example inside the target as shown in FIG. 7. The magnetron 714 has opposed magnets (S, N) for creating magnetic field within the chamber near by the magnetron 714. The magnetic field confines secondary electrons, for charge neutrality, so that the ion density would increase to form a high density plasma 750 within the chamber adjacent to the magnetron 714. The magnetron 714 is stationery about the central axis of the target 716 to achieve full coverage during sputtering of the target 716. The magnetron 714 may have variable sizes, positions, and a number of shapes for controlling the degree of plasma ionization. The magnetron 714 may have any shapes, among others, an oval, a triangle, a circle, and a flattened kidney shape. The magnetron 714 may also have an unbalanced design, i.e. the magnetic flux of the outer pole may be greater than the magnetic flux produced by the inner pole. A few references are provided here, e.g. U.S. Pat. No. 5,242,566 for a flattened kidney shape magnetron, U.S. Pat. No. 6,306,265 for a triangularly shaped outer pole, U.S. Pat. No. 6,290,825 for different shapes of magnetron. Each of the foregoing patents is incorporated herein by reference for all purposes.

The coaxial microwave antenna 710 may be subjected to a pulsed or continuous power 752 to radiate microwaves. The microwaves input energy into the plasma and the plasma is heated to enhance ionization and thus increase plasma density. The coaxial microwave antenna 710 may comprise a plurality of coaxial microwave antennas. The length of coaxial antenna 710 may be up to approximately 3 m in some embodiments. One aspect of the coaxial microwave antenna 710 is to provide homogeneous discharge adjacent to sputtering cathode or target 716. This would allow uniform deposition of a large area over substrate 720.

For the purpose of controlling the deposition of sputtered layer 718 on substrate 720, the substrate 720 may be biased by a RF power 830 coupled to the substrate supporting member 724 which is provided centrally below and spaced apart from the target 716, usually within the interior of the shield 754. The bias power may have a typical frequency of 13.56 MHz, or more generally between 400 kHz to about 500 MHz. The supporting member is electrically conductive and is generally coupled to ground or to another relatively positive reference voltage so as to define a further electrical field between the target 716 and the supporting member 724. The substrate 720 may be a wafer, such as a silicon wafer, or a polymer substrate. The substrate 720 may be heated or cooled during sputtering, as a particular application requires. A power supply 762 may provide current to a resistive heater 764 embedded in the substrate supporting member 724, commonly referred to as a pedestal, to thereby heat the substrate 720. A controllable chiller 760 may circulate chilled water or other coolants to a cooling channel formed in the pedestal. It is desirable that the deposition of film 718 be uniform across the entire top surface of the substrate 720.

Vacuum pump 726 can pump the chamber 748 to a very low base pressure in the range of $10^{-8}$ torr. A gas source 740 connected to the chamber 748 through a mass flow controller 742 supplies inert gases such as argon (Ar), helium (He), xenon (Xe), and/or combinations thereof. The gases may be flowed into the chamber near the top of the chamber as illustrated in FIG. 7 above the target 716, or in the middle of the chamber (not shown) between the substrate 720 and target 716. The pressure of the gases inside the chamber is typically maintained between 0.2 mtorr and 100 mtorr.

A microprocessor controller 728 controls the mass flow controller 742, a high frequency power supply 732, a DC power supply 738, a microwave power supply 752, a bias power supply 730, a resistive heater 764 and a chiller 760. The controller 728 may include, for example, a memory such as random access memory, read only memory, a hard disk drive, a floppy disk drive, or any other form of digital storage, local or remote, and a card rack coupled to a general purpose computer processor (CPU). The controller operates under the control of a computer program stored on the hard disk or through other computer programs, such as stored on a removable disk. The computer program dictates, for example, the timing, mixture of gases, DC or RF power applied on targets, biased RF power for substrate, pulsed power or continuous power to the microwave source, substrate temperature, and other parameters of a particular process.

5. Exemplary Deposition Process

Figure 8:
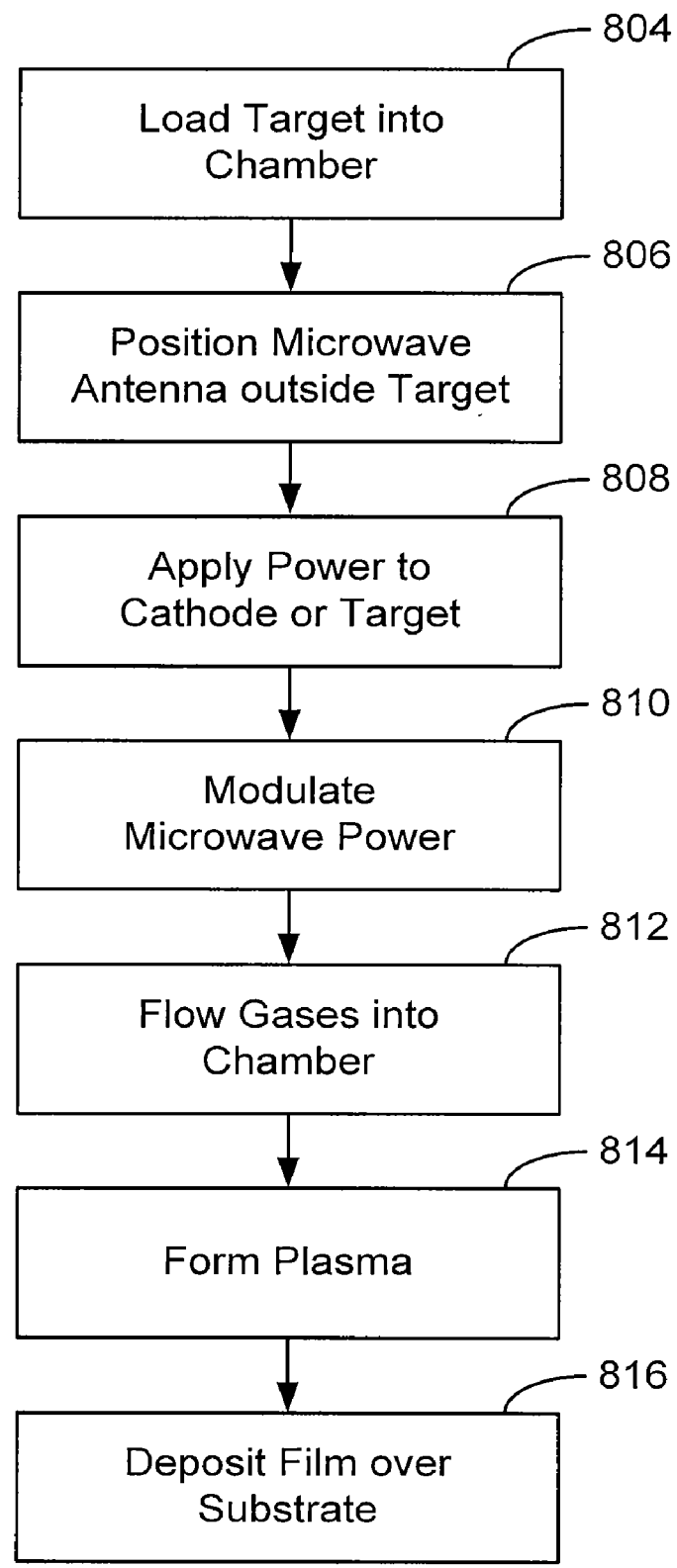
FIG. 8 is a flow chart for illustrating simplified deposition steps for forming a film on a substrate.

For purposes of illustration, FIG. 8 provides a flow diagram of a process that may be used to form a film on a substrate. First, a sputtering target is loaded into a processing chamber at block 804. A coaxial microwave antenna is positioned inside the sputtering target at block 806 to generate microwaves. An electric voltage is applied to a sputtering cathode target by a power source at block 808. The power source is at least one of DC, AC, RF or pulsed power. The power of the microwaves may be modulated at block 810, for instance, by a power supply using a pulsing power or a continuous power. Then, gases such as sputtering agents are flowed into the processing chamber at block 812.

The carrier gases may act as a sputtering agent. For example, the carrier gas may be provided with a flow of $H_2$ or with a flow of inert gas, including a flow of He or even a flow of a heavier inert gas such as Ar. The level of sputtering provided by the different carrier gases is inversely related to their atomic mass. Flow may sometimes be provided of multiple gases, such as by providing both a flow of $H_2$ and a flow of He, which mix in the processing chamber. Alternatively, multiple gases may sometimes be used to provide the carrier gases, such as when a flow of $H_2$/He is provided into the processing chamber.

As indicated at block 814, a plasma is formed from the gases by a sputtering cathode and further enhanced by microwaves at a frequency ranging from 1 GHz to 10 GHz, for example, commonly at 2.45 GHz (a wavelength of 12.24 cm). In addition, a higher frequency of 5.8 GHz is often used when power requirement is not as critical. The benefit of using a higher frequency source is that it has smaller size (about half size) of the lower frequency source of 2.45 GHz.

In some embodiments, the plasma may be a high-density plasma having an ion density that exceeds $10^{12}$ ions/cm$^3$. Also, in some instances the deposition characteristics may be affected by applying an electrical bias to the substrate. Application of such a bias causes the ionic species of the plasma to be attracted to the substrate, sometimes resulting in increased sputtering. The environment within the processing chamber may also be regulated in other ways in some embodiments, such as controlling the pressure within the processing chamber, controlling the flow rates of the gases and where they enter the processing chamber, controlling the power used in generating the plasma, controlling the power used in biasing the substrate and the like. Under the conditions defined for processing a particular substrate, material is thus deposited over the substrate as indicated at block 816.

6. Exemplary Coaxial Microwave Source and Features

Figure 9A:
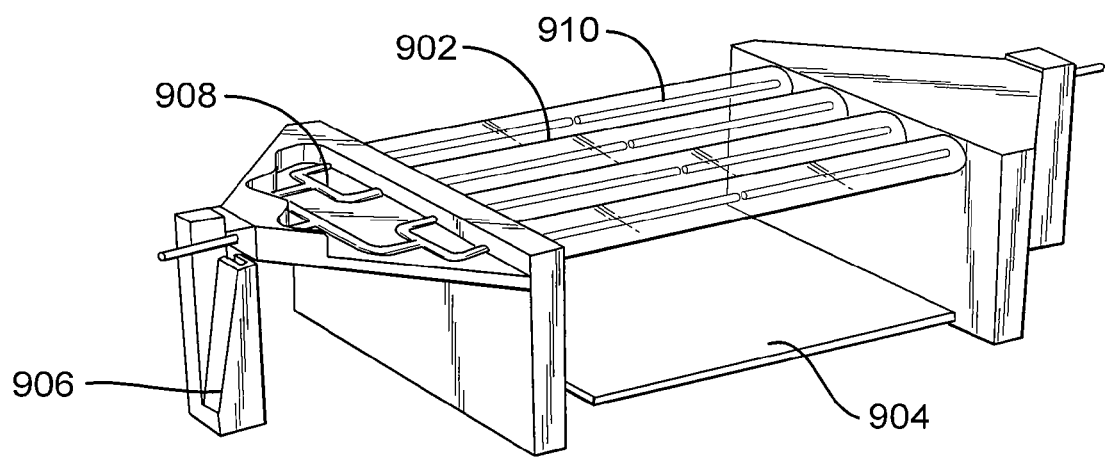
FIG. 9A provides a simplified schematic of a planar plasma source consisting of 4 coaxial microwave line sources.

FIG. 9A shows a schematic of a simplified system including a planar coaxial microwave source 902 consisting of 4 coaxial microwave line sources 910, a substrate 904, a coaxial power provider 908 and an impedance matched rectangular waveguide 906. The coaxial microwave line source may be formed from a coaxial cable by replacing an outer conductive layer through using an electrically conductive plasma. The microwave propagation along the coaxial microwave line source experiences a high attenuation by converting electromagnetic wave energy into heating plasma.

The coaxial cable is an electrically conducting cable comprising a substantially round inner conducting center wire being surrounded by a dielectric spacer and then an outer cylindrical conducting layer. Electromagnetic field may be present substantially in the dielectric spacer between the inner conducting center wire and outer cylindrical conducting layer.

In the coaxial microwave line source 910, microwaves are radiated into the chamber in a transversal electromagnetic (TEM) mode where no electric or magnetic field is along the axial or longitudinal direction. This is different from waveguide where electromagnetic waves propagate in a transverse electric (TE) or transverse magnetic (TM) mode. In the TE mode, the electric field is entirely transverse, but the magnetic field has longitudinal components. On the other hand, in the TM mode, the magnetic field is entirely transverse, but the electric field has longitudinal components.

A tube that comprises a dielectric material of a high heat resistance and a low dielectric loss, such as quartz or alumina, acts as the interface between the waveguide and the vacuum chamber. Between the dielectric layer and the waveguide, an atmospheric pressure is maintained by using gases such as air or nitrogen to help cool the waveguide. Microwaves can leak through the dielectric material and ignite a plasma discharge in the processing chamber.

Figure 9B:
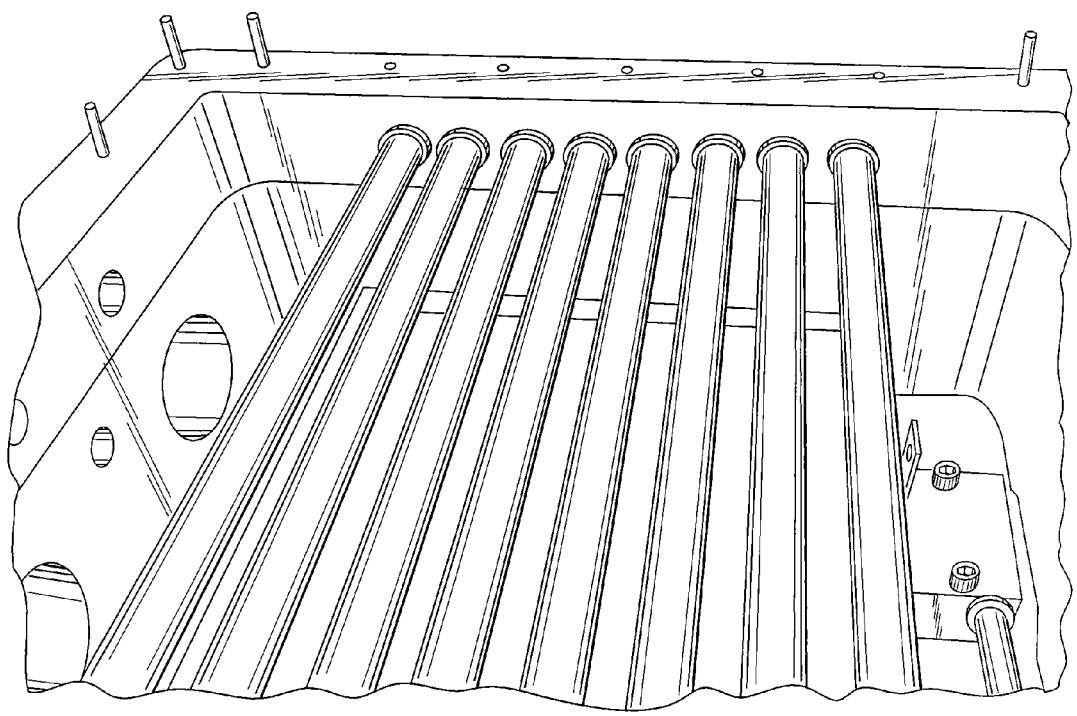
FIG. 9B provides an optical image of a planar microwave source consisting of 8 parallel coaxial microwave plasma sources.

FIG. 9B shows an optical image of a planar coaxial microwave source consisting of 8 parallel coaxial microwave line sources. The length of each coaxial microwave line may be up to approximately 3 m in some embodiments.

Typically, the microwave plasma line uniformity is about +/−15%. The inventors have performed experiments to demonstrate that approximately +/−1.5% of homogeneity over 1 m$^2$ can be achieved in dynamic array configuration and 2% over 1 m$^2$ in static array configurations. This homogeneity may be further improved to be below +/−1% over large areas.

Furthermore, when plasma density increases to above 2.2× $10^{11}$/cm$^3$, the plasma density starts to saturate with increasing microwave power. The reason for this saturation is that the microwave radiation is reflected more once the plasma density becomes dense. Due to the limited power in available microwave sources, microwave plasma line sources of any substantial length may not achieve optimal plasma conditions i.e. very dense plasma. Pulsing microwave power into magnetron allows for much higher peak energy into the antenna than continuous microwave, such that the optimal plasma condition can be approached.

Figure 10:
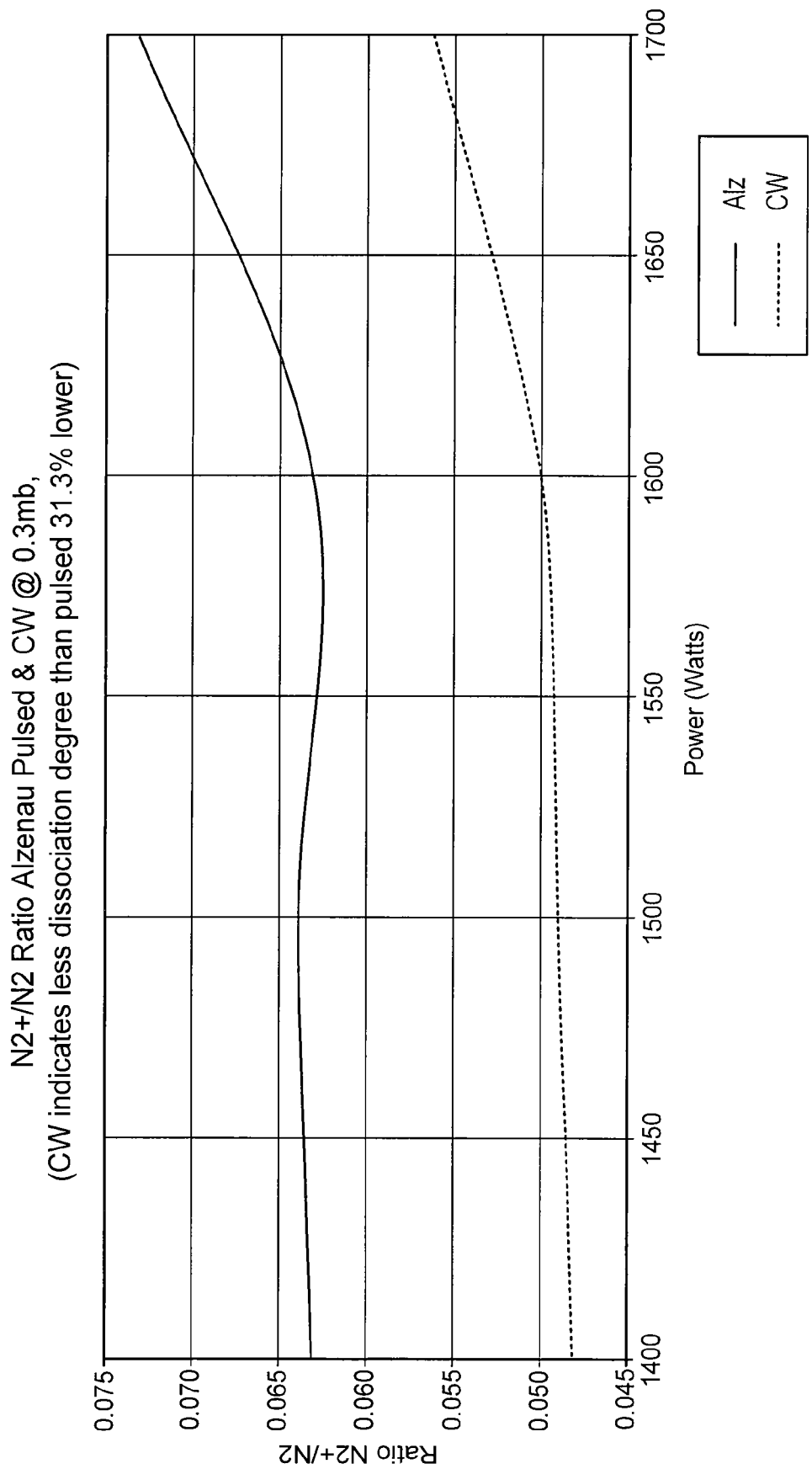
FIG. 10 is a graph showing the improved plasma efficiency in using pulsed microwave power when compared to continuous microwave power.

FIG. 10 shows graph which illustrates the improved plasma efficiency of pulsing microwave over continuous microwave, assuming that the pulsing microwave has the same average power as the continuous microwave. Note that continuous microwave results in less disassociation as measured by the ratio of nitrogen radical $N_2+$ over neutral $N_2$. A 31% increase in plasma efficiency can be achieved by using pulsed microwave power.

While the above is a complete description of specific embodiments of the present invention, various modifications, variations and alternatives may be employed. Moreover, other techniques for varying the parameters of deposition could be employed in conjunction with the coaxial microwave source. Examples of the possible variations include but are not limited to various configurations of rotatable targets assisted with a coaxial microwave antenna with or without magnetrons, different shapes of magnetron, the DC, RF or pulsed power to the target, the microwave source, linear or planar, pulsed or continuous power to the microwave source, the RF bias condition for the substrate, the temperature of the substrate, the pressure of deposition, and the flow rate of inert gases and the like.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

What is claimed is:

1. A system for microwave-assisted rotatable sputtering deposition, the system comprising:
   a processing chamber;
   a rotatable target disposed inside the processing chamber;

a power supply in electrical communication with the rotatable target and being adapted to apply a voltage to the rotatable target;

a coaxial microwave antenna located outside the rotatable target for emitting microwaves, wherein the microwaves are pulsed and wherein the coaxial microwave antenna does not include an outer conductive layer;

a gas system configured for supplying gases into the processing chamber; and a substrate support member configured in the processing chamber for holding the substrate.

2. The system for microwave-assisted rotatable sputtering deposition of claim 1, wherein the rotatable target comprises a dielectric material, a metal or semiconductor.

3. The system for microwave-assisted rotatable sputtering deposition of claim 1, wherein the power supply comprises at least one of DC, AC, RF or pulsed power supply.

4. The system for microwave-assisted rotatable sputtering deposition of claim 1, wherein the rotatable target comprises a plurality of rotatable targets positioned substantially symmetrically about the coaxial microwave antenna.

5. The system for microwave-assisted rotatable sputtering deposition of claim 1, wherein the rotatable target has a cross section that is substantially symmetric about a central axis of the rotatable target.

6. The system for microwave-assisted rotatable sputtering deposition of claim 5, wherein the cross section is substantially circular or annular.

7. The system for microwave-assisted rotatable sputtering deposition of claim 1, wherein the microwaves are in a transversal electromagnetic wave (TEM) mode.

8. The system for microwave-assisted rotatable sputtering deposition of claim 1, wherein a magnetron is positioned proximate the rotatable target.

9. The system for microwave-assisted rotatable magnetron sputtering deposition of claim 8, wherein the rotatable target comprises at least two targets and the magnetron comprises at least two magnetrons proximate the targets, the two said targets being positioned substantially symmetrically about the coaxial microwave antenna.

10. The system for microwave-assisted rotatable sputtering deposition of claim 8, wherein the rotatable target comprises a dielectric material, a metal or semiconductor.

11. The system for microwave-assisted rotatable sputtering deposition of claim 8, wherein the rotatable target has a cross section that is substantially symmetric about a central axis of the rotatable target.

12. The system for microwave-assisted rotatable sputtering deposition of claim 8, wherein the cross section is substantially circular or annular.

13. A method for microwave-assisted rotatable sputtering deposition, the method comprising:

rotating a target within a processing chamber;

applying at least one of DC, AC, RF or pulsed power to the target;

generating microwaves from a coaxial microwave antenna positioned outside the target, wherein the coaxial microwave antenna does not include an outer conductive layer;

modulating a power of the generated microwaves;

flowing gases into the processing chamber;

forming a plasma from the gases with the generated microwaves; and forming a film on a substrate from the plasma.

14. The method recited in claim 13, wherein the microwaves are in a transversal electromagnetic wave (TEM) mode.

15. The method recited in claim 13, further comprising disposing a magnetron proximate the target.

16. The method recited in claim 13, wherein the coaxial microwave antenna comprises a plurality of parallel coaxial microwave antennas.

17. The method recited in claim 13, wherein the rotatable target comprises dielectric materials, metals or semiconductors.

18. The method recited in claim 13, wherein the rotatable target has a cross section that is substantially symmetric about a central axis of the rotatable target.

19. The method recited in claim 13, further comprising biasing the substrate supporting member with an RF power.

* * * * *